United States Patent [19]
Sakurai et al.

[11] Patent Number: 5,642,326
[45] Date of Patent: Jun. 24, 1997

[54] DYNAMIC MEMORY

[75] Inventors: Kiyofumi Sakurai; Satoru Takase; Masaki Ogihara, all of Yokohama, Japan

[73] Assignee: Kabushiki Kaisha Toshiba, Kawasaki, Japan

[21] Appl. No.: 534,558

[22] Filed: Sep. 27, 1995

[30] Foreign Application Priority Data

Sep. 29, 1994 [JP] Japan .................................. 6-234743

[51] Int. Cl.$^6$ ............................................. G11C 7/00
[52] U.S. Cl. .............................. 365/230.06; 365/193
[58] Field of Search ........................... 365/193, 194, 365/195, 230.06

[56] References Cited

U.S. PATENT DOCUMENTS 3,969,706  7/1976  Proebsting et al. ..................... 365/193
5,031,150  7/1991  Ohsawa ................................. 365/193

*Primary Examiner*—Joseph A. Popek
*Attorney, Agent, or Firm*—Banner & Witcoff, Ltd.

[57] ABSTRACT

A dynamic memory comprises a control circuit for controlling the selection of the row decoder and the activation of the sense amplifiers in accordance with a $\overline{RAS}$ signal externally supplied thereto and a word line control circuit for controlling a selected word line to turn the electric potentials read out from the memory cells connected to the word line on the bit lines connected to the respective memory cells back to an inactive level after the electric potentials are sensed and amplified by the sense amplifiers corresponding to the respective bit lines during the time period from the time when the $\overline{RAS}$ signal is turned to an active level and the time when it is turned back to the inactive level. A dynamic memory has gate oxide films are designed to be subjected to a less electric field strength in order to minimize the degradation of reliability and the memory can effectively reduce the fall of the word line driving stepped-up voltage to eliminate the necessity of a leak current compensation circuit. Additionally, the memory reduces the time required to restore the electric potentials for a data reading operation and also the cycle time required for a data writing operation.

14 Claims, 8 Drawing Sheets

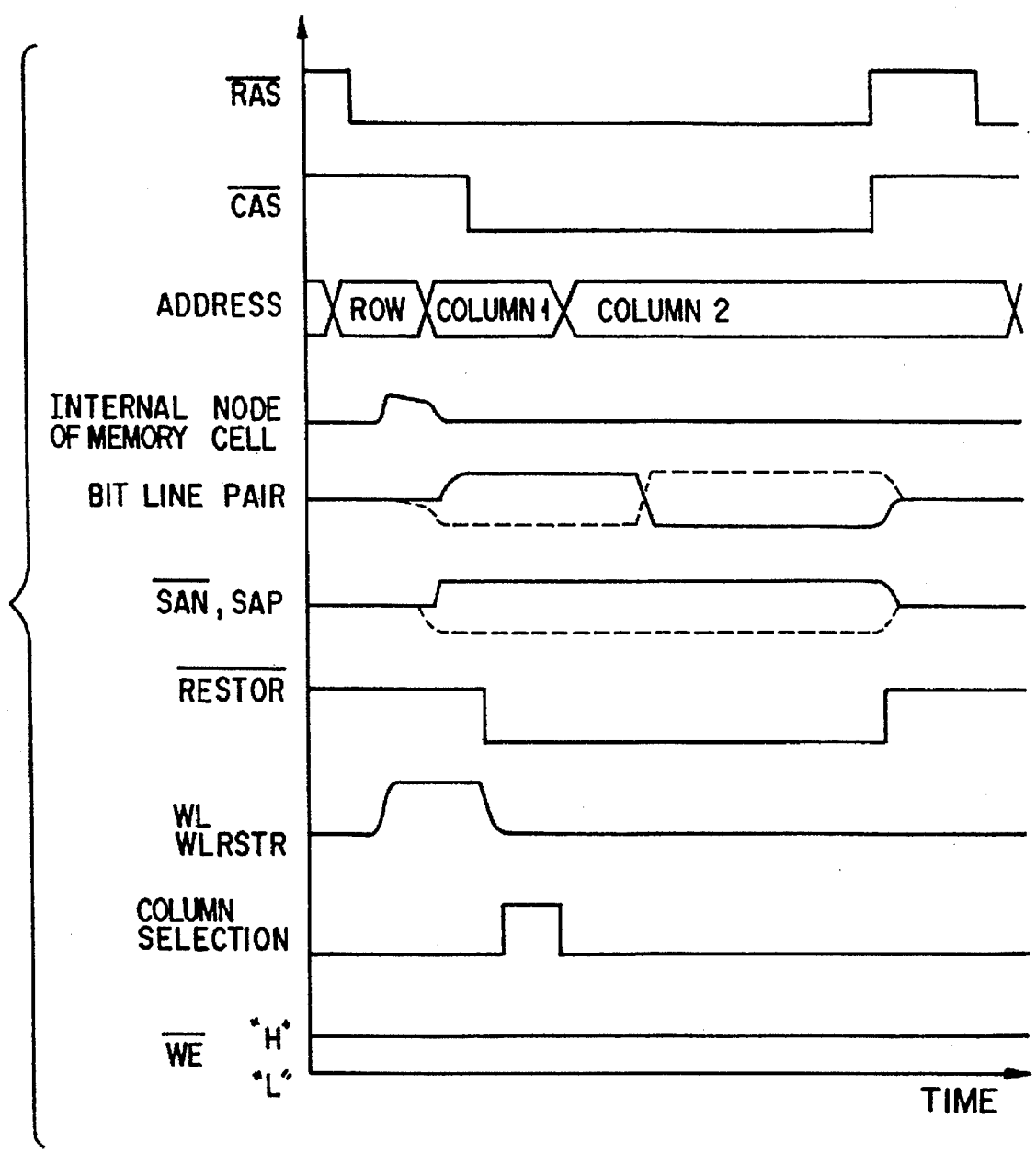
F I G. 2

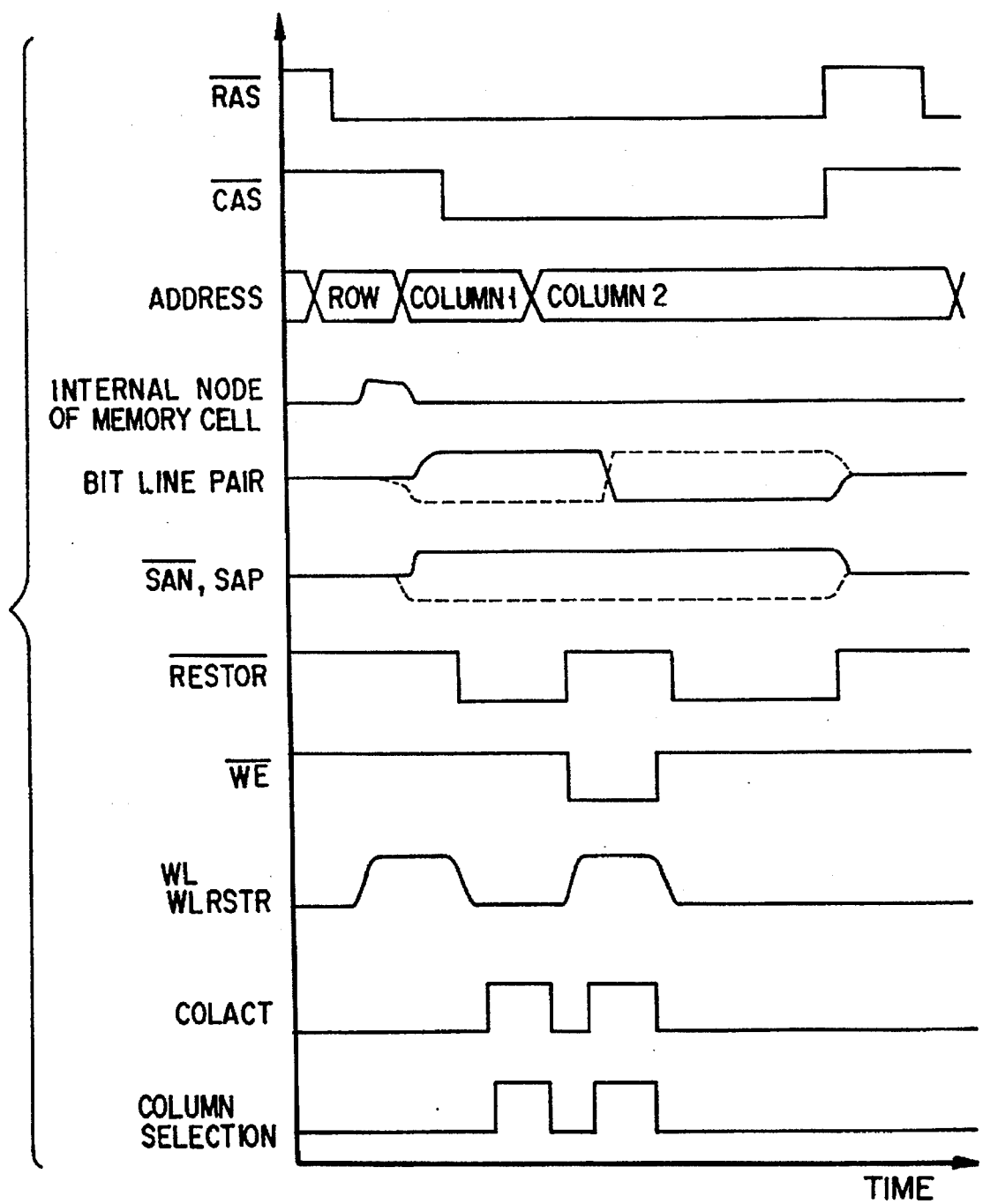
F I G. 4

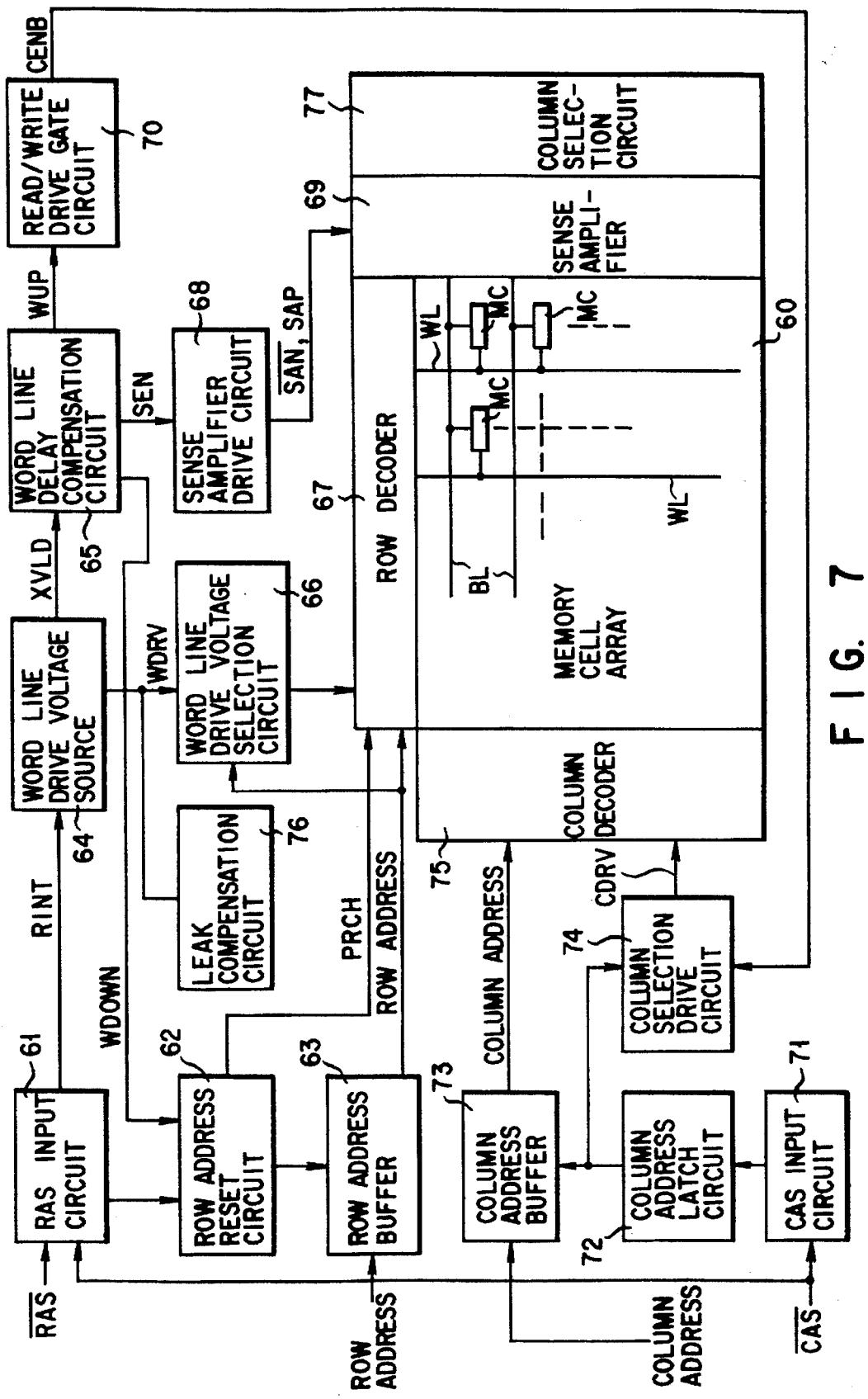
F I G. 7

DYNAMIC MEMORY

BACKGROUND OF THE INVENTION

1. Field of the Invention

This invention relates to a semiconductor memory device and, more particularly, it relates to a word line control circuit of a dynamic memory (DRAM).

2. Description of the Related Art

FIG. 7 shows a schematic block diagram of a typical conventional DRAM. Since such a block diagram is very popular and well known to those who are interested in the related field of technology, it will not be described here any further. Referring to FIG. 7, each of the memory cells (DRAM cells) MC arranged to form a matrix in the memory cell array 60 has a single transistor/single capacitor arrangement comprising a transistor Q for data transfer and a capacitor C for data hold connected in series as illustrated in FIG. 8. The transistor Q is typically a N-channel insulated gate field effect transistor (NMOS transistor) having its drain and gate respectively connected to a bit line BL and a word line WL.

For writing data into or reading data out of a selected memory cell MC, a word line drive voltage having a voltage level higher than that of the power source voltage Vcc of the DRAM by at least the threshold voltage of the transistor Q is applied to the word line WL to obtain an electric charge sufficient to carry out an operation of reading data from or writing data into the capacitor C.

A typical data writing/reading operation of the DRAM of FIG. 7 will be described by referring to FIG. 9. In the following description, the expression "internal node" of a memory cell refers to the node connecting a transistor Q and a capacitor C in a memory cell having a single transistor/single capacitor arrangement as illustrated in FIG. 8. When accessing a memory cell MC, as a row address strobe signal $\overline{RAS}$ externally supplied to the RAS input circuit 61 goes to the active level ("L"), all the row-related circuits start operating. Under this condition, the row decoder 67 selects a word line WL designated by the signal obtained by decoding the row address signal from the row address buffer circuit 62. The selected word line WL is activated as a word line driving stepped-up voltage (stepped-up voltage of the power source voltage) is supplied thereto via the word line voltage selection circuit 66. Note that, each word line WL gets to the active level (or inactive level) very slowly due to its parasitic capacitance and resistance.

As the selected word line is activated, the data stored in the memory cells connected thereto are read out onto the bit lines BLs to which the memory cells are connected respectively. At the same time, the data in the dummy cells connected to a dummy word line are drawn out onto the bit lines (not shown) that are complementary relative to the above bit lines BLs and to which the dummy cells are connected respectively. The difference between the electric potential of each of the bit lines BLs and that of the corresponding one of the complementary bit lines is sensed and amplified by the corresponding one of the sense amplifiers 69 (arranged corresponding to the respective pairs of the bit lines BLs and the complementary bit lines although they are shown as a single block 69 in FIG. 7). Meanwhile, there is a time lag, or delay, from the instant when the voltage of the selected word line rises to the time when the data stored in the memory cells MCs are read out onto the bit lines BLs. To compensate the delay, the word line delay compensation circuit 65 transmits to the sense amplifier drive circuit 68 a sense amplifier control signal SEN that is compensated for the delay and the sense amplifier drive circuit 68 supplies the sense amplifier 69 with a sense amplifier activation signal $\overline{SAN}$, SAP according to the control signal SEN. The electric potential of the bit lines and that of the complementary bit lines of the above bit line pairs are set to level "H" and level "L" respectively by the output of the sense amplifiers to refresh the memory cells connected to the selected word line.

Then, as a column address strobe signal $\overline{CAS}$ externally supplied to the CAS input circuit 71 is activated and goes to level "L", all the column-related circuits start operating. Under this condition, the column decoder 75 selects a column or a bit line according to the signal obtained by decoding the column address signal. Then, the output (read out data) of the sense amplifier corresponding to the selected column are drawn onto a data line DQ (not shown). Thereafter, as the $\overline{RAS}$ signal and the $\overline{CAS}$ signal are turned back to the inactive level ("H"), the selected word line also goes back to the inactive level ("L") and the electric potentials of the bit line pairs and those of the input/output node pairs of the sense amplifiers connected thereto respectively are equalized.

As for writing data, a write enable signal $\overline{WE}$ is turned to the active level ("L") while a selected word line and the related sense amplifiers are activated. Consequently, the data to be written are stored in the sense amplifier for the selected column via a data lines DQ. Thereafter, the $\overline{RAS}$ signal and the $\overline{CAS}$ signal are turned back to the inactive level ("L") to complete a cycle of operation of writing data into the memory cells.

With the above conventional technique of accessing a memory cell, the selected word line is held to the active level all the time from the instant when a supplied $\overline{RAS}$ signal is turned to the active level to the instant when it is turned back to the inactive level and the time is considerably long. More specifically, since the selected word line is held to the active level (or a word line driving stepped-up voltage is applied to the gates of the memory cells of the selected row) for a long time, a high electric field strength come to be applied to the gate oxide films of the NMOS transistors of the memory cells of the selected row to eventually reduce the reliability of the memory cells.

Additionally, during the time when the selected word line is held to the active level, the word line driving stepped-up voltage falls gradually because of the leak current of the transistors of the transfer blocks of the word lines of all the unselected rows and that of the PN junctions. This fact provides another problem when a $\overline{RAS}$ signal is activated for a long time. In order for a $\overline{RAS}$ signal to be activated for a long time nevertheless, the leak current compensation circuit 76 has to be arranged on the output side of the word line drive voltage source 64 to consequently increase the overall patterned area and the electric power consumption of the device.

Still additionally, for a data reading operation, the electric potentials of the bit line pairs and those of the corresponding input/output node pairs of the sense amplifiers connected thereto are equalized after the $\overline{RAS}$ signal is turned back from the active level to the inactive level so that a prolonged period of time is required to restore the electric potentials for another data reading operation (or precharge the bit line pairs and the input/output node pairs for another reading operation).

Finally, for writing data at the completely "H" or "L" level into a memory cell in a data writing operation, the selected word line has to be completely turned back to the inactive level as a result of the level shift of the $\overline{\text{RAS}}$ signal from the active level to the inactive level before the electric potentials of the bit line pairs and the corresponding input/ output node pairs of the sense amplifiers connected thereto are equalized so that a prolonged cycle time is required for a data writing operation.

In short, the selected word line of a conventional DRAM is required to stay at the active level for a prolonged period of time and a high electric field strength come to be applied to the gate oxide films of the NMOS transistors of the memory cells of the selected row to eventually degrade the gate oxide films and reduce the reliability of the memory cells. Additionally, the provision of a leak compensation circuit for the prevention of a fall of the level of the word line driving stepped-up voltage significantly increases the overall patterned area and the electric power consumption of the device.

Furthermore, since the electric potentials of the bit line pairs and those of the corresponding input/output node pairs of the sense amplifiers connected thereto are equalized only after the $\overline{\text{RAS}}$ signal is turned back from the active level to the inactive level, a prolonged period of time is required to restore the electric potentials for a data reading operation and also a prolonged cycle time is consumed for a data writing operation.

SUMMARY OF THE INVENTION

In view of the above problems, it is therefore an object of the present invention to provide a dynamic memory whose gate oxide films are designed to be subjected to a less electric field strength in order to minimize the degradation of reliability. It is another object of the present invention to provide a dynamic memory that can effectively reduce the fall of the word line driving stepped-up voltage to eliminate the necessity of a leak current compensation circuit so that the overall patterned area and the electric power consumption of the device may be effectively reduced. It is still another object of the present invention to provide a dynamic memory that can reduce the time required to restore the electric potentials for a data reading operation and also the cycle time required for a data writing operation.

According to the invention, the above objects are achieved by providing a dynamic memory comprising a memory cell array of dynamic memory cells arranged to form a matrix, a plurality of word lines connected to each of the memory cells of the respective rows of the memory cell array, a plurality of bit lines connected to each of the memory cells of the respective columns of the memory cell array, a row decoder for driving the word lines, a column selection circuit for selecting the bit lines, a column decoder for driving the column selection circuit, a plurality of sense amplifiers for sensing and amplifying the electric potentials read out from the memory cells onto the bit lines and establishing electric potentials for data to be written therein on the bit lines, a control circuit for controlling the selection of the row decoder and the activation of the sense amplifiers in synchronism with a $\overline{\text{RAS}}$ signal externally supplied thereto and a word line control circuit for controlling a selected word line to turn the electric potentials read out from the memory cells connected to the word line on the bit lines connected to the respective memory cells back to an inactive level after the electric potentials are sensed and amplified by the sense amplifiers corresponding to the respective bit lines during the time period from the time when the $\overline{\text{RAS}}$ signal is turned to an active level and the time when it is turned back to the inactive level.

The word line control circuit preferably operates to equalize the electric potentials of the bit lines and those of the input/output node pairs of the sense amplifiers immediately after the selected word line is turned back to the inactive level.

The word line control circuit preferably operates for a data writing operation after the electric potential of the selected word line is turned back to the active level to bring the electric potential of the selected word line back to the active level again in synchronism with a write enable signal.

After bringing the electric potential of the selected word line back to the active level again, the word line control circuit may alternatively so operate as to bring the electric potential of the selected word line back to the inactive level as the $\overline{\text{RAS}}$ signal is turned back to the inactive level. Still alternatively, after bringing the electric potential of the selected word line back to the active level again, it may so operate as to bring the electric potential of the selected word line back to the inactive level without waiting for the $\overline{\text{RAS}}$ signal to be turned back to the inactive level.

With a dynamic memory according to the invention, the time period during which the selected word line is held to the active level is reduced since the selected word line is brought back to the inactive level after the data to be read out are determined during the time period from the time when the $\overline{\text{RAS}}$ signal is turned to the inactive level and the time when it is returned to the inactive level.

Thus, the time period during which the word line driving stepped-up voltage is applied to the gates of the memory cells of a selected row is significantly reduced to lower the electric field strength applied to the gate oxide films of the cell transistors so that the reliability of the memory cells is relieved of damage. Additionally, since any possible reduction in the word line driving stepped-up voltage due to the leak current of the transistors of the transfer blocks of the word lines of all the unselected rows and that of the PN junctions can be minimized, the provision of a leak compensation circuit may be omitted so that the overall patterned area and the electric power consumption of the device may be effectively reduced.

Since the electric potentials of the bit line pairs and those of the inactive levels of the corresponding input/output node pairs of the sense amplifiers connected thereto may be equalized after the data to be read out are determined during the time period from the time when the $\overline{\text{RAS}}$ signal is turned to the inactive level and the time when it is returned to the inactive level, the time required to restore the electric potentials for a data reading operation can be significantly reduced.

Still additionally, since the electric potentials of the bit line pairs and those of the corresponding input/output node pairs of the sense amplifiers connected thereto may be equalized after the $\overline{\text{RAS}}$ signal is turned back to the inactive level for a write operation, the cycle time required for a data writing operation can be significantly reduced. If a data writing operation is carried out after a data reading operation, the selected word line may be activated immediately before the data reading operation so that the time required to precharge the bit line pairs can be greatly reduced.

Finally, since the active period of a $\overline{\text{RAS}}$ signal can be prolonged with a dynamic memory according to the invention, the time required to precharge a $\overline{\text{RAS}}$ signal in the inactive period (in a stand-by state) can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a timing chart for a data reading operation of the DRAM of FIG. 1;

FIG. 4 is a timing chart for a data reading operation and a subsequent data writing operation of a second embodiment of DRAM according to the invention illustrated in FIG. 10;

FIG. 7 is a schematic block diagram of a conventional DRAM;

DETAILED DESCRIPTION OF THE PREFERRED EMBODIMENTS

Figure 1:
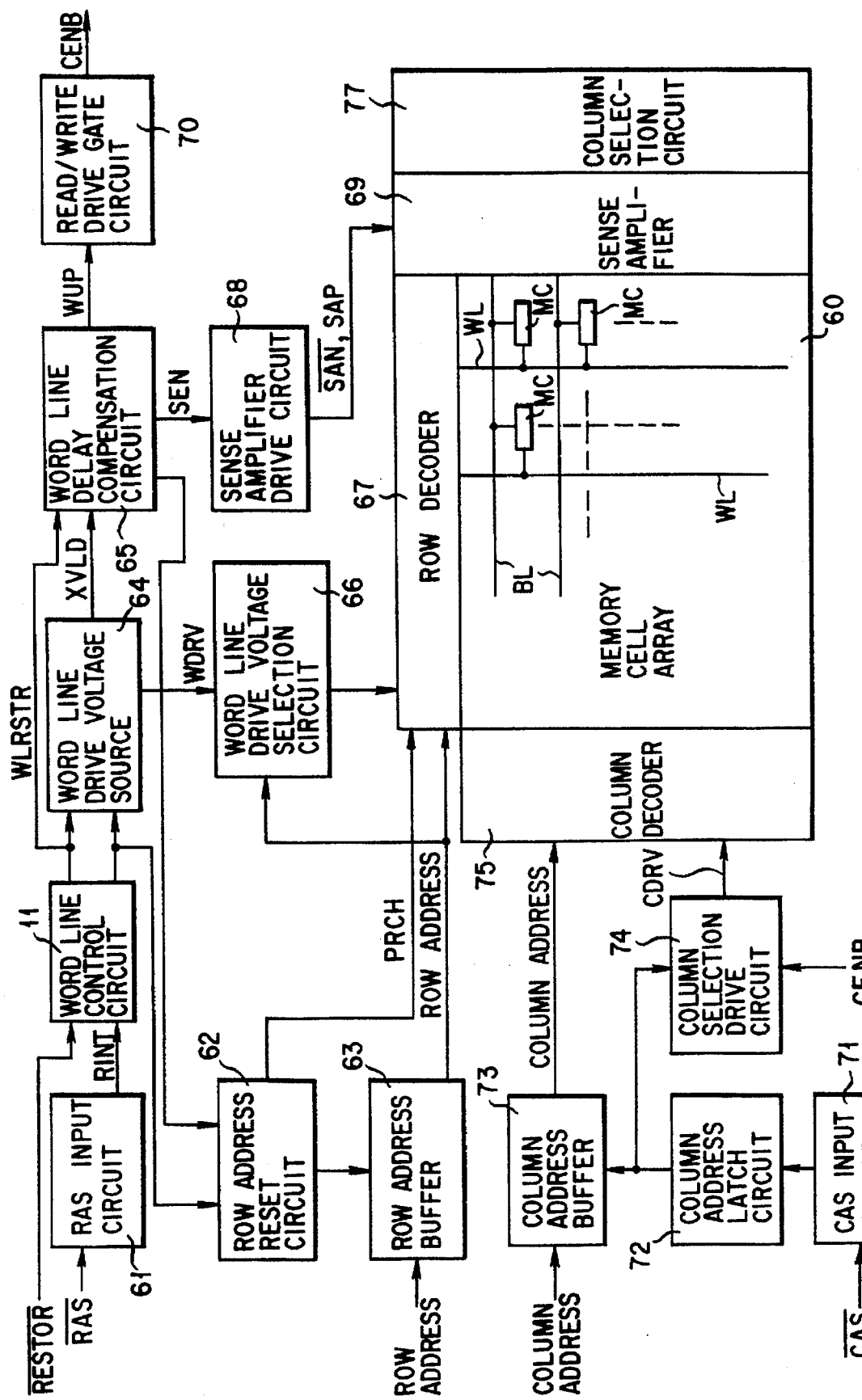
FIG. 1 is a schematic block diagram of a first embodiment of DRAM according to the invention.

Now, the present invention will be described by referring to the accompanying drawings that illustrate preferred embodiments of the invention. FIG. 1 is a schematic block diagram of a first embodiment of DRAM according to the invention. The DRAM differs from the conventional DRAM described earlier by referring to FIG. 7 in that it additionally comprises a word line control circuit 11 for receiving a restore signal $\overline{\text{RESTOR}}$, that a control signal WLRSTR produced by the word line control circuit 11 is fed to the word line drive voltage source 64 and the word line delay compensation circuit 65 and that the leak compensation circuit 76 of the DRAM of FIG. 7 is omitted.

Referring to FIG. 1, the memory cells in the memory cell array 60 have a single transistor/single capacitor arrangement and are arranged in the form of a matrix. A word line WL is connected to all the memory cells MCs of each row of the memory cell array 60, whereas a bit line BL is connected to all the memory cells MCs of each column of the memory cell array 60.

While the sense amplifiers 69 and the column selection circuits 77 are collectively shown in FIG. 1 for the purpose of simplification, the columns are respectively provided with the sense amplifiers and the column selection circuits 77. Each of the sense amplifiers senses and amplifies the electric potentials read out from the memory cells connected thereto to the related bit lines BLs for a data reading operation and set up an electric potential on the bit lines BLs for the data to be written in order to carry out a data writing operation. Each of the sense amplifiers comprises an NMOS amplifier to be used for sensing an electric potential and a PMOS amplifier to be used for restoring an electric potential.

The row related principal circuits of the embodiment include a RAS input circuit 61 for receiving an externally supplied $\overline{\text{RAS}}$ signal, a row address reset circuit 62, a row address buffer circuit 63, a word line drive voltage source 64, a word line delay compensation circuit 65, a word line drive voltage selection circuit 66 and a sense amplifier drive circuit 68, which constitute a control circuit for controlling the selection of the word lines WLs and the activation of the sense amplifiers 69 in accordance with an externally supplied $\overline{\text{RAS}}$ signal.

As will be described hereinafter, the word line delay compensation circuit 65 produces a sense amplifier control signal SEN compensated for the delay time from the rising edge of the voltage applied to the selected word line up to the time when the data of the memory cells connected to the selected word line are read out on the bit lines and a control signal WUP.

The row address reset circuit 62 transmits a precharge signal PRCH in accordance with a control signal WDOWN (FIG. 6) from the word line delay compensation circuit 65. The row address reset circuit 62 also receives a control signal RSTR from the word line control circuit 11 and outputs a control signal to the row address buffer circuit 63. The row address buffer circuit 63 receives a row address signal and holds the row address signal while the output control signal of the row address reset circuit 62 is activated.

The row decoder 67 receives the row address signal from the row address buffer circuit 63 and decodes the row address signal to select a word line. The word line drive voltage selection circuit 66 supplies the word line driving stepped-up voltage from the word line drive voltage source 64 in accordance with the signal output from the row address buffer circuit 63.

The sense amplifier drive circuit 68 produces a sense amplifier activation signal $\overline{\text{SAN}}$, SAP according to the sense amplifier control signal SEN supplied from the word line delay compensation circuit 65 in order to drive the sense amplifiers 69.

Referring further to FIG. 1, the read/write drive gate circuit 70 produces a column enable control signal CENB according to the control signal WUP supplied from the word line delay compensation circuit 65. The column related principal circuits of the embodiment include a CAS input circuit 71 for receiving an externally supplied $\overline{\text{CAS}}$ signal, a column address latch circuit 72 for latching the column address signal input for a predetermined period of time, a column address buffer circuit 73, a column selection drive circuit 74 and a column decoder 75.

The column selection drive circuit 74 is activated by a column enable control signal CENB supplied from the read/write drive gate circuit 70 and sends out a control signal CDRV for controlling the time period for column selection to the column decoder 75.

The column decoder 75 receives the column address signal from the column address buffer circuit 73 and decodes the column address signal to control the column control circuit 77.

In the above embodiment, the word line control circuit 11 sends out a control signal WLRSTR so as to bring the electric potential of the selected word line back to the inactive level after the electric potentials read out from the memory cells connected to the selected word line to the bit lines connected to the memory cells are sensed and amplified by the corresponding sense amplifiers according to the restore signal $\overline{\text{RESTOR}}$ and the output signal RINT of the RAS input circuit 61 and, if a data writing operation is carried out thereafter, activate the selected word line once again. In the embodiment of FIG. 1, a control signal WLRSTR is also used to control the word line drive voltage source 64. A control signal WLRSTR is further used to control the word line delay compensation circuit 65 to maintain the operation of the sense amplifiers when the selected word line is temporarily held to an inactive state.

Figure 8:
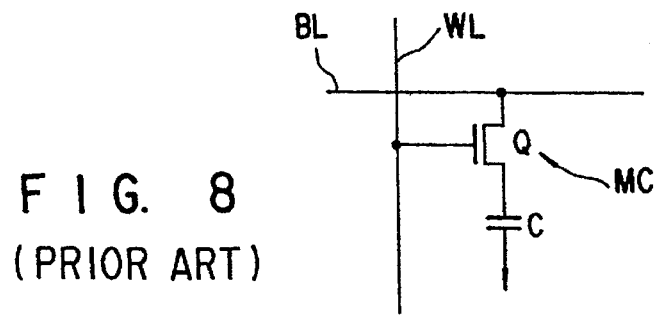
FIG. 8 is a schematic circuit diagram of a memory cell of the memory cell array of FIG. 7 comprising memory cells arranged in the form of a matrix.
Figure 9:
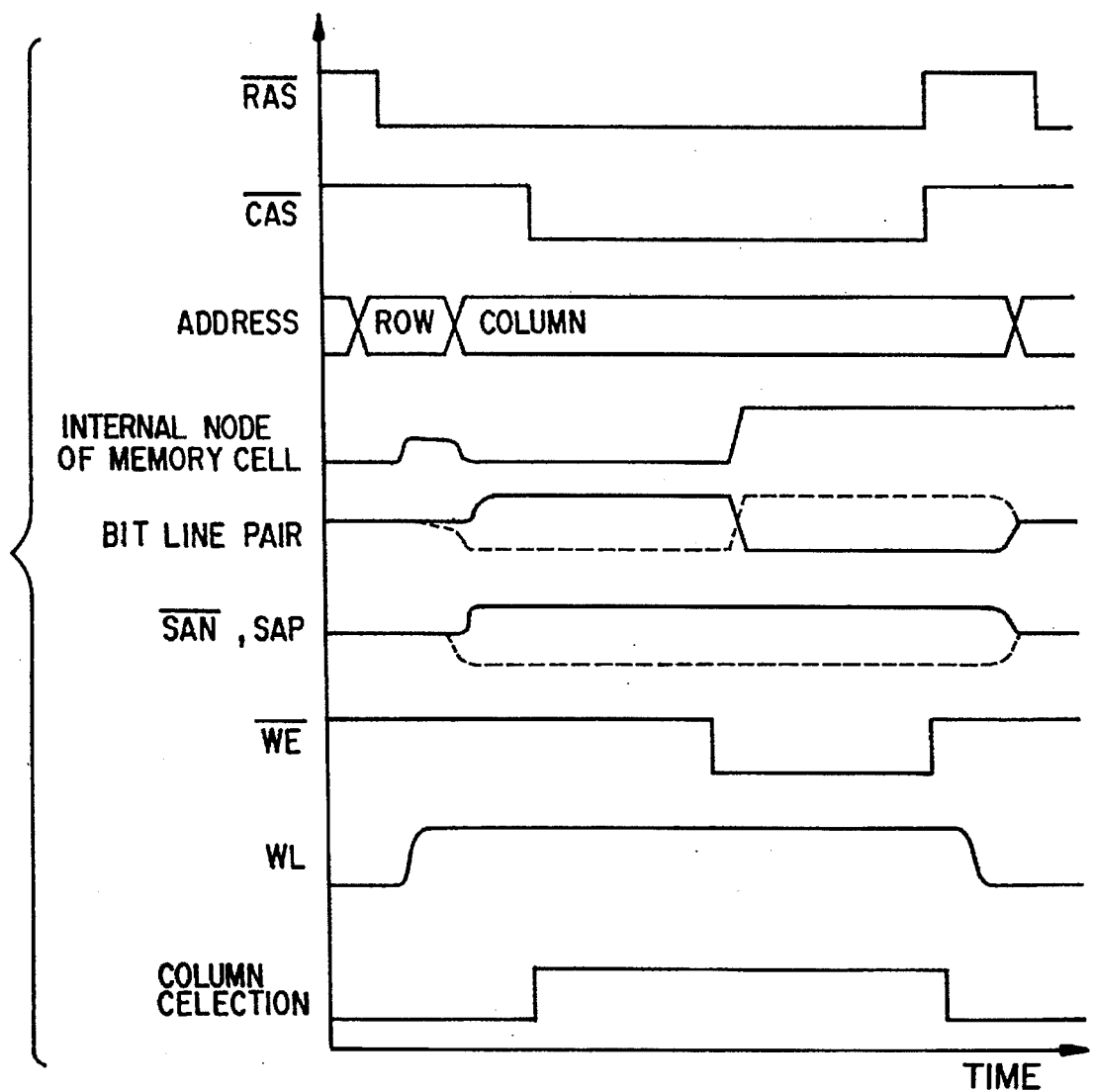
FIG. 9 is a timing chart for a data writing/reading operation of some of the principal components of the conventional DRAM of FIG. 7.

A DRAM of FIG. 1 operates for reading data according to the timing chart illustrated in FIG. 2, which will be described hereinafter. In FIG. 2, the internal node of a memory cell refers to the connection node between the transistor Q and the capacitor C of a memory cell having a single transistor/single capacitor arrangement as shown in FIG. 8.

For accessing a memory cell MC, as a $\overline{\text{RAS}}$ signal is turned to the active level ("L"), the row related circuits start operating. More specifically, the row decoder 67 selects the word line WL designated by the signal obtained by decoding the row address signal from the row address buffer circuit 63. Then, the selected word line WL is fed with a word line driving stepped-up voltage from the word line drive voltage source 64 via the word line drive voltage selection circuit 66 to become activated. Note that, each word line WL gets to the active level (or inactive level) very slowly due to its parasitic capacitance and resistance.

As the selected word line is activated, the data stored in the memory cells connected to the selected word line are respectively read out to the corresponding bit lines BLs. At the same time, the data stored in the dummy memory cells (not shown) connected to a dummy word line (not shown) are respectively read out to the corresponding bit lines (not shown) that are complementary relative to the respective bit lines BLs so that the potential difference generated in each bit line pair is sensed and amplified by the corresponding sense amplifier 69 (comprising an NMOS amplifier to be used for sensing an electric potential and a PMOS amplifier to be used for restoring an electric potential).

Meanwhile, a sense amplifier activation signal $\overline{\text{SAN}}$, SAP is supplied to the sense amplifiers 69 from the sense amplifier drive circuit 68 according to the sense amplifier control signal SEN from the word line delay compensation circuit 65 that is compensated for the delay time from the rising edge of the voltage applied to the selected word line up to the time when the data of the memory cells connected to the selected word line are read out.

At the same time, the bit lines of each of the bit line pairs are respectively held to the "H" and "L" levels by the output of the corresponding sense amplifier 69 to rewrite data (refresh) the memory cells connected to the selected word line.

After the read out data are determined, the selected word line is inactivated (i.e., its electric potential is lowered) as the restore signal $\overline{\text{RESTOR}}$ is activated and the bit line pairs and the corresponding input/output node pairs of the sense amplifiers connected thereto are equalized.

Thereafter, as the $\overline{\text{CAS}}$ signal is activated (to "L" level), the column related circuits start operating. More specifically, the column decoder 75 decodes the column address signal from the column address buffer circuit 73 and selects a column by driving the column selection circuit according to the signal obtained by decoding the column address signal during a column selection period which is controlled by a column enable signal CENB. The column decoder 75 then causes the output of the sense amplifier (read out data) corresponding to the selected column to be drawn to the data line DQ (not shown).

Subsequently, the selected word line returns to the selectable state as the restore signal $\overline{\text{RESTOR}}$ is inactivated again. Thereafter, the $\overline{\text{RAS}}$ signal and the $\overline{\text{CAS}}$ signal are brought back to the inactive level to completely inactivate all the sense amplifiers.

Figure 3:
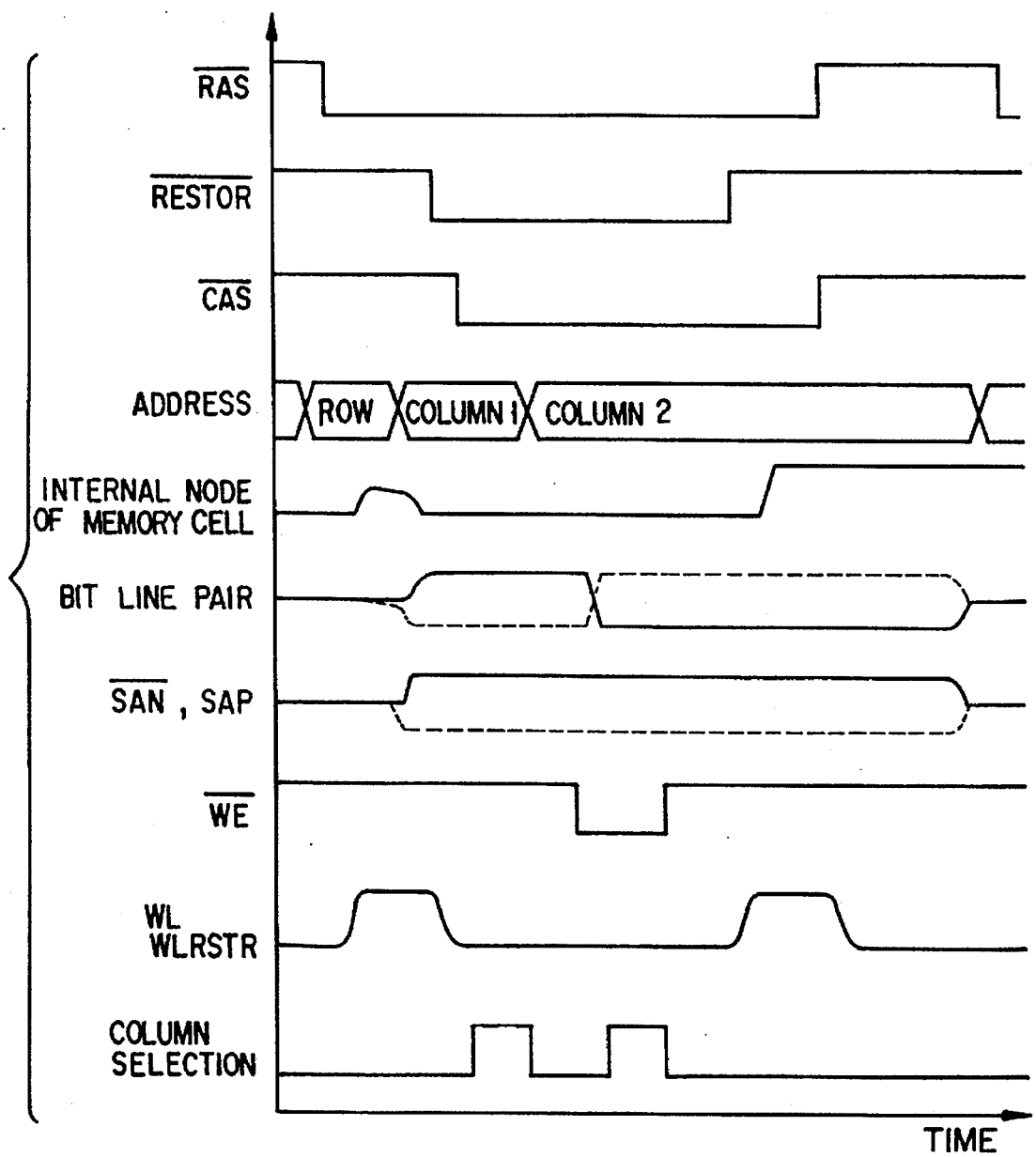
FIG. 3 is a timing chart for a data writing operation of the DRAM of FIG. 1.

FIG. 3 is a timing chart for a data reading operation and a subsequent data writing operation of the DRAM of FIG. 1. In FIG. 3, the sequence up to the completion of a data reading operation is identical with that of FIG. 2. Thereafter, a $\overline{\text{WE}}$ signal is activated for a data writing operation and a column is selected by the column address obtained as a result of the activation of the $\overline{\text{WE}}$ signal. Note that the selected word line is inactivated under this condition while the sense amplifiers are activated so that the data to be written into the bit line of the selected column are determined as data is written in the sense amplifier of the selected column. Thereafter, the selected word line is activated again as the restore signal $\overline{\text{RESTOR}}$ is inactivated. Finally, the $\overline{\text{RAS}}$ signal is brought back to the inactive level to completely inactivate the selected word line and complete the operation of writing data into the memory cells.

While FIG. 3 shows a timing chart with which a single data writing operation is carried out after the completion of a data reading operation and therefore the restore signal $\overline{\text{RESTOR}}$ is activated for only once, the restore signal $\overline{\text{RESTOR}}$ may be activated for a number of times if a data writing operation is repeated for that number of times after the completion of a data reading operation.

With the above described first embodiment, since the selected word line is restored to the inactive level after the end of a data reading operation during the time period from the time when the $\overline{\text{RAS}}$ signal is turned to the active level and the time when it is brought back to the inactive level, the time period during which the selected word line is maintained to the active level is significantly reduced. Consequently, the time during which the word line driving stepped-up voltage is applied to the gates of the memory cells of the selected row is reduced to lower the electric field strength applied to the gate oxide films of the transistors of the memory cells to suppress any possible degradation of the memory cells and hence the reliability of the memory cells remain undamaged. Additionally, since any possible reduction in the word line driving stepped-up voltage due to the leak current of the transistors of the transfer blocks of the word lines of all the unselected rows and that of the PN junctions can be minimized, the provision of a leak compensation circuit may be omitted so that the overall patterned area and the electric power consumption of the device may be effectively reduced.

Since the electric potentials of the bit line pairs and those of the inactive levels of the corresponding input/output node pairs of the sense amplifiers connected thereto may be equalized after the completion of a data reading operation during the time period from the time when the $\overline{\text{RAS}}$ signal is turned to the inactive level and the time when it is returned to the inactive level, the time required to restore the electric potentials for a data reading operation can be significantly reduced and make the device ready for a next access.

Still additionally, since the electric potentials of the bit line pairs and those of the corresponding input/output node pairs of the sense amplifiers connected thereto may be equalized after the $\overline{RAS}$ signal is turned back to the inactive level for a write operation, the cycle time required for a data writing operation can be significantly reduced. If a data writing operation is carried out after a data reading operation, the selected word line may be activated immediately before the data reading operation so that the time required to precharge the bit line pairs can be greatly reduced.

Finally, since the active period of a $\overline{RAS}$ signal can be prolonged with a dynamic memory according to the invention, the time required to precharge a $\overline{RAS}$ signal in the inactive period (in a stand-by state) can be significantly reduced.

While the time during which the column selection drive circuit 74 is activated is controlled by a column enable control signal CENB transmitted from the read/write drive gate circuit 70 to control the time allotted for column selection in the above first embodiment, such a column enable control signal may be replaced by a column action control signal COLACT supplied externally to the column selection drive circuit 74 to control the activated period of the column selection drive circuit 74.

Figure 10:
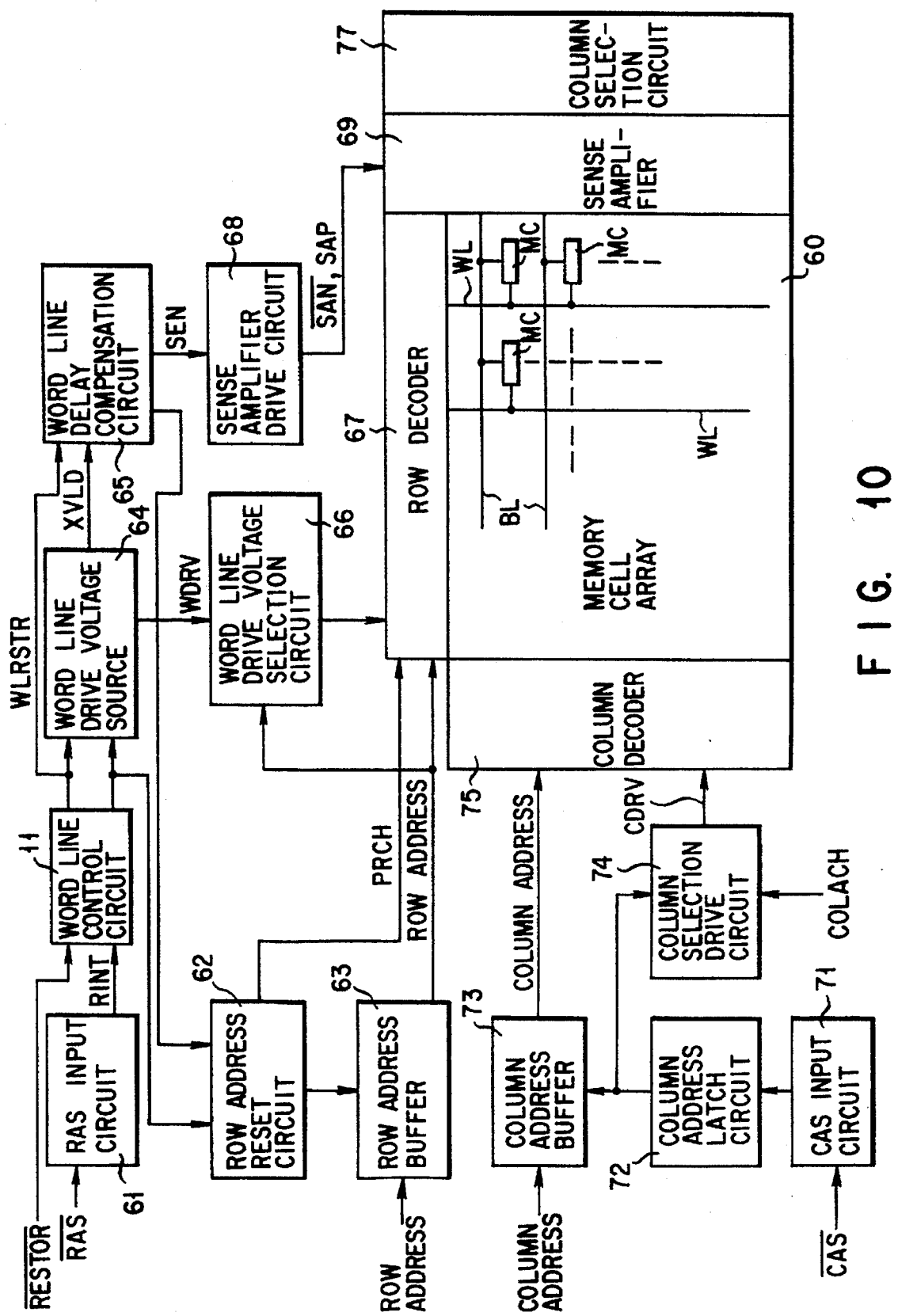
FIG. 10 is a schematic block diagram of a second embodiment of DRAM according to the invention.

Now, a second embodiment of DRAM according to the invention will be described. As shown in FIG. 10, this second embodiment of DRAM differs from the first embodiment in that (1) the word line control circuit 11 operates to send out a restore signal $\overline{RESTOR}$ for inactivating or activating the word line for a desired number of times during the activated period of the $\overline{RAS}$ signal and (2) a column action control signal COLACT is supplied externally to the column selection drive circuit 74 to control the activated period of the column selection drive circuit 74 in place of a column enable control signal CENB.

FIG. 4 is a timing chart for a data reading operation and a subsequent data writing operation of the second embodiment of DRAM illustrated in FIG. 10. The data reading operation and the subsequent data writing operation of this second embodiment of DRAM differ from those of the first embodiment of DRAM described above by referring to FIG. 3 in that (1) the column selection period is controlled by a column action control signal COLACT and (2) the data of the bit line pairs are determined while the selected word line is activated for carrying out a data writing operation after a data reading operation and subsequently the operation of writing data into the memory cells is terminated when the selected word line is inactivated according to a restore signal $\overline{RESTOR}$. Otherwise, the operation of the second embodiment is same as that of the first embodiment.

Figure 5:
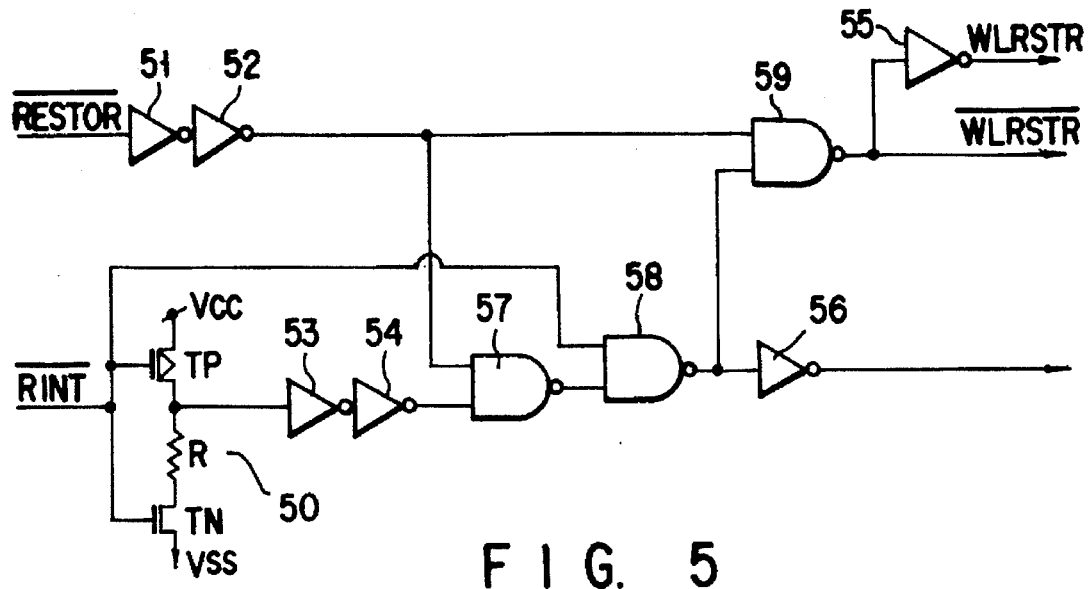
FIG. 5 is a logic circuit diagram of a word line control circuit that can be used for the embodiment of FIG. 1.

FIG. 5 is a logic circuit that can be used for the word line control circuit 11 of FIG. 1. In FIG. 5, reference numerals 51 through 56 denote respective MOS inverter circuits and reference numerals 57 through 59 denote respective two-input NAND circuits. Reference numeral 50 denotes a modified MOS inverter circuit, where a resistor R is inserted between a PMOS transistor TP and an NMOS transistor NP having their gates connected with each other. A restore signal $\overline{RESTOR}$ is supplied to the inverter 51 and an output signal $\overline{RINT}$ of the RAS input circuit 51 is given to the gates of the transistors TP and NP and the input terminal of the NAND gate 58. Then, the inverter 55 gives out a control signal WLRSTR while the NAND gate 59 transmits a control signal $\overline{WLRSTR}$.

Figure 6:
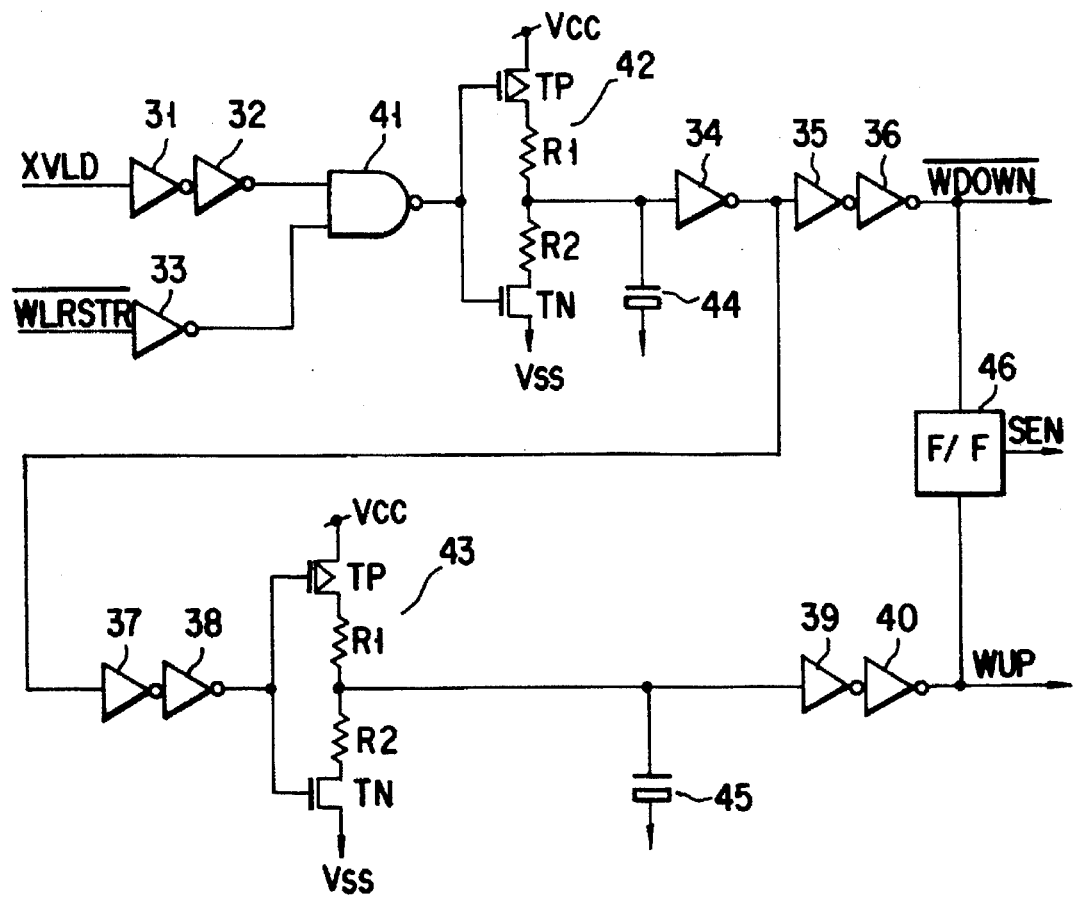
FIG. 6 is a logic circuit diagram of a word line delay compensation circuit that can be used for the embodiment of FIG. 1.

FIG. 6 shows a logic circuit that can be used for the word line delay compensation circuit 65 of FIG. 1. In FIG. 6, reference numerals 31 through 40 denote respective MOS inverter circuits and reference numeral 41 denotes a two-input NAND circuit. Reference numerals 42 and 43 respectively denote modified CMOS inverter circuits, each obtained by connecting a pair of resistors R1 and R2 in series between a PMOS transistor TP and an NMOS transistor NP. Reference numerals 44 and 45 respectively denote capacitors, each comprising a MOS transistor. Reference numeral 46 denotes a flip-flop circuit, which is set by a WUP signal and reset by a $\overline{WDOWN}$ signal to transmit a SEN signal. The XVLD signal from the word line drive voltage source 64 is applied to the inverter 31 and the $\overline{WLRSTR}$ signal from the word line control circuit 11 is given to one of the input terminal of the NAND circuit 41.

A quick access to a DRAM can be achieved by using a page mode or a static column mode. Alternatively, such a quick access can be achieved by using cache memories. Cache memories may be realized by adding SRAM cells. Thus, the present invention can be applied to a DRAM employing the sense amplifier cache system, with which a sense amplifier is provided for each of the columns of the DRAM.

Japanese Patent Publication No. 4-131095 of the inventor of the present invention discloses a DRAM employing the sense amplifier cache system. In this DRAM, the memory area of the DRAM is divided into a plurality of subarrays, which are operated independently so that bit line sense amplifiers may be used as cache memories to improve the hit rate of the cache memories.

The sense amplifier cache system will be described below briefly. Assume here that the DRAM is ready to be accessed by a MPU (microprocessor) and the data read out of the memory cells having a row address have already been latched to the sense amplifiers.

If the row address is accessed (hit) under this condition, the data in the memory cells for the row address have already been latched to the sense amplifiers and, therefore the data can be produced as an output by operating only the column related circuits without using the row related circuits to eliminate the time required for the access by the row related circuits and reduce the overall time required for the access.

If, to the contrary, the data for a row address have not been latched to the sense amplifiers (and are missing), after the data read out into the sense amplifiers are rewritten into the memory cells (or after the sense amplifiers are equalized), the data read out from the memory cells of a new row address are latched to the sense amplifiers.

Thus, with a DRAM according to the invention, the electric field strength applied to the gate oxide films of the cell transistors can be reduced to relieve the reliability of the memory from damage. Additionally, any reduction in the word line driving stepped-up voltage can be suppressed and the provision of a leak compensation circuit can be omitted to reduce the time required for the restoration of data in a data reading operation and also the cycle time of a data writing operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic memory device comprising:

a memory cell array of dynamic memory cells arranged in rows and columns;

a plurality of word lines connected to the memory cells of the respective rows of said memory cell array;

a plurality of bit lines connected to the memory cells of the respective columns of said memory cell array;

a row decoder for driving said word lines;

a column selection circuit for selecting said bit lines;

a column decoder for driving said column selection circuit;

a plurality of sense amplifiers for sensing and amplifying the electric potentials read out from said memory cells onto said bit lines and establishing electric potentials for data to be written in said memory cells on said bit lines;

a control circuit for controlling the selection of said row decoder and the activation of said sense amplifiers in accordance with a /RAS signal supplied thereto: and a word line control circuit for controlling a selected word line back to an inactive level after the electric potentials read out onto said bit lines from the memory cells connected to the selected word line are sensed and amplified by said sense amplifiers during a time period from a time when the /RAS signal is switched to an active level to the time when the /RAS signal is switched back to an inactive level.

2. A dynamic memory device according to claim 1, wherein said word line control circuit operates to equalize the electric potentials of said bit lines and the electric potentials of said sense amplifiers immediately after the selected word line is switched back to the inactive level.

3. A dynamic memory device according to claim 1 or 2, wherein said word line control circuit operates for a data writing operation after the electric potential of the selected word line is switched back to the active level to bring the electric potential of the selected word line back to the active level again in synchronism with a write enable signal.

4. A dynamic memory device according to claim 3, wherein, after switching the electric potential of the selected word line back to the active level again, said word line control circuit so operates as to switch the electric potential of the selected word line back to the inactive level as the $\overline{RAS}$ signal is switched back to the inactive level.

5. A dynamic memory device according to claim 3, wherein, after switching the electric potential of the selected word line back to the active level again, said word line control circuit so operates as to switch the electric potential of the selected word line back to the inactive level without waiting for the $\overline{RAS}$ signal to be switched back to the inactive level.

6. A semiconductor memory device, comprising:

memory cells connected to word lines and bit lines;

an /RAS input terminal for receiving a row address strobe (/RAS) signal having an active period which defines a memory cycle;

a row decoder for decoding a row address to select one of said word lines during the memory cycle;

word line driving circuitry for activating the selected word line by applying a first potential thereto and for deactivating the selected word line by applying a different second potential thereto;

sense amplifiers connected to said bit lines; and a control circuit for controlling said word line driving circuitry to activate the selected word line during a first portion of the memory cycle and to deactivate the selected word line during a second portion of the memory cycle subsequent to the first portion.

7. A semiconductor memory device according to claim 6, wherein said second portion of the memory cycle is after said sense amplifiers sense data read out to said bit lines from memory cells connected to the selected word line which is activated during the first portion of the memory cycle.

8. A semiconductor memory device according to claim 6, wherein said control circuit controls said word line driving circuitry to re-activate the selected word line during a third portion of the memory cycle subsequent to the second portion.

9. A semiconductor memory device according to claim 6, further comprising:

a /CAS input terminal for receiving a column address strobe (/CAS) signal having an active period during the memory cycle; and a column decoder for decoding a column address to select one of said sense amplifiers during the active period of the /CAS signal.

10. A semiconductor memory device according to claim 9, wherein said column decoder decodes a read column address for reading data from said memory cells during a first portion of the active period of the /CAS signal and decodes at least one write column address for writing data to said memory cells during a second portion of the active period of the /CAS signal subsequent to the first portion.

11. A semiconductor memory device according to claim 6, wherein the first potential applied by said word line driving circuitry has a voltage level higher than a voltage level of a power source voltage Vcc.

12. A semiconductor memory device according to claim 6, wherein said memory cells comprise dynamic memory cells.

13. A semiconductor memory device according to claim 6, wherein said semiconductor memory device comprises a cache memory.

14. A semiconductor memory device, comprising:

memory cells connected to word lines and bit lines;

an /RAS input terminal for receiving a row address strobe (/RAS) signal having an active period which defines a memory cycle;

a row decoder for decoding a row address to select one of said word lines during the memory cycle;

word line driving circuitry for activating the selected word line by applying a first potential thereto and for deactivating the selected word line by applying a different second potential thereto;

sense amplifiers connected to said bit lines; and a control circuit for controlling said word line driving circuitry to deactivate the selected word line during at least a portion of the memory cycle which is after said word line driving circuitry activates the selected word line and which is after said sense amplifiers sense data read out to said bit lines from memory cells connected to the activated selected word line.

* * * * *